(12) United States Patent
Uchibori

(10) Patent No.: US 6,214,444 B1
(45) Date of Patent: *Apr. 10, 2001

(54) CIRCUIT-LIKE METALLIC FOIL SHEET AND THE LIKE AND PROCESSING FOR PRODUCING THEM

(75) Inventor: Shinya Uchibori, Hiroshima (JP)

(73) Assignee: Kabushiki Kaisha Miyake (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/898,077

(22) Filed: Jul. 22, 1997

Related U.S. Application Data

(63) Continuation of application No. 08/431,691, filed on Apr. 28, 1995, now abandoned, and a continuation-in-part of application No. 08/366,548, filed on Dec. 30, 1994, now Pat. No. 5,645,932.

(30) Foreign Application Priority Data

Dec. 30, 1993 (JP) .................................................... 5-354105
Dec. 1, 1994 (JP) .................................................... 6-323506

(51) Int. Cl.[7] .................................................. B32B 15/00
(52) U.S. Cl. .......................... 428/209; 428/458; 428/461; 428/901; 428/421
(58) Field of Search .................................. 340/258, 568, 340/572; 361/397, 402, 410; 428/204, 458, 422, 421, 457, 461, 901; 29/548

(56) References Cited

U.S. PATENT DOCUMENTS

| 2,969,300 | | 1/1961 | Franz . | |
|---|---|---|---|---|
| 4,021,705 | * | 5/1977 | Lichtblau | 361/402 |
| 4,369,557 | * | 1/1983 | Vandebult | 29/25.42 |

(List continued on next page.)

FOREIGN PATENT DOCUMENTS

| 142380 | 5/1985 | (EP) . |
|---|---|---|
| 0316847 | 11/1987 | (EP) . |
| 285559 | 5/1988 | (EP) . |
| 0340670 | 4/1989 | (EP) . |
| 2211702 | 7/1989 | (GB) . |
| 9221113 | 11/1992 | (WO) . |

Primary Examiner—Merrick Dixon
(74) Attorney, Agent, or Firm—Fredrikson & Byron

(57) ABSTRACT

A resonant tag is provided that comprises a circuit-like metallic foil pattern that is adhered to a dielectric film prepared from a liquid resin by a coating process. The circuit-like metal foil pattern on one side of the dielectric film may be so aligned with the circuit-like metal foil pattern on the other side of the dielectric film as to form a capacitor with the dielectric film. The dielectric film may have openings therein configured similarly to and aligned with openings in the circuit-like metal foil, and the configuration of the circuit-like metal foil pattern and dielectric film may be generally spiral in configuration. An adhesion adhesive may be coated on predetermined portions of a face of a resonant tag base so as to leave uncoated portions between the coated portions, and a release paper is applied to the adhesion adhesive, the width of the uncoated portions being such as to avoid the generation of static electricity when the release paper is peeled from the adhesion adhesive.

2 Claims, 17 Drawing Sheets

U.S. PATENT DOCUMENTS

| | | |
|---|---|---|
| 4,495,232 | 1/1985 | Bauser et al. . |
| 4,717,438 | 1/1988 | Benge et al. . |
| 4,778,552 * | 10/1988 | Benge et al. ............. 156/272.2 |
| 4,797,785 | 1/1989 | Jorgensen . |
| 4,818,312 | 4/1989 | Benge . |
| 4,846,922 * | 7/1989 | Benge et al. ............... 156/324 |
| 4,970,495 * | 11/1990 | Matsumoto . |
| 5,006,856 | 4/1991 | Benge et al. . |
| 5,059,950 | 10/1991 | Perchak . |
| 5,119,070 * | 6/1992 | Matsumoto et al. ............ 340/572 |
| 5,165,987 * | 11/1992 | Oehlmann et al. ............ 428/209 |
| 5,170,544 * | 12/1992 | Pichl ............................ 29/25.42 |
| 5,174,847 | 12/1992 | Pichl . |
| 5,184,111 | 2/1993 | Pichl . |
| 5,201,988 * | 4/1993 | Matsumoto et al. ............ 156/634 |

* cited by examiner

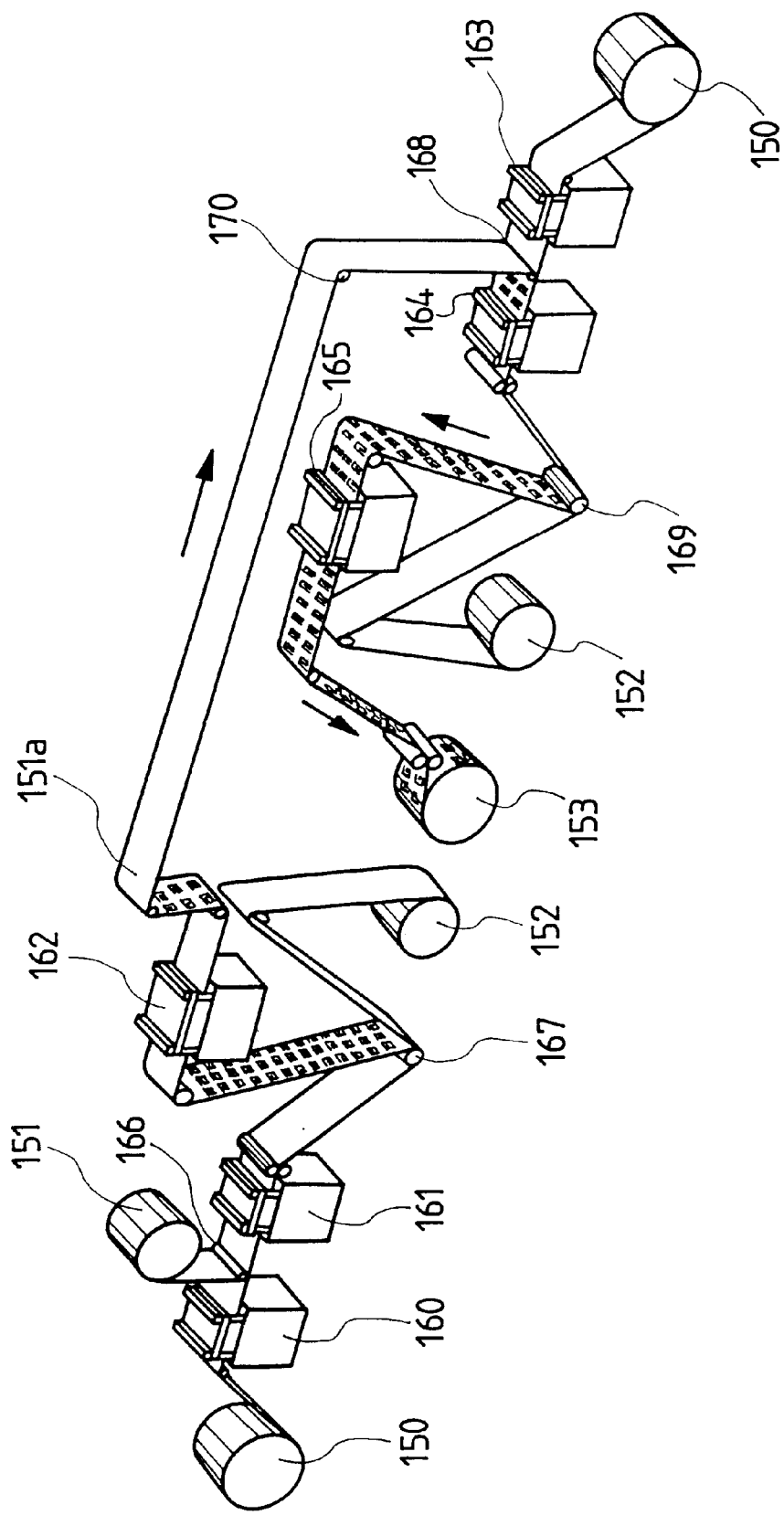

FIG. 16
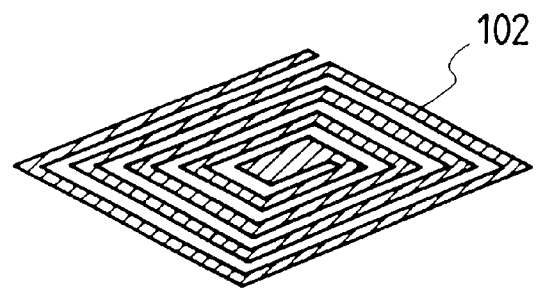
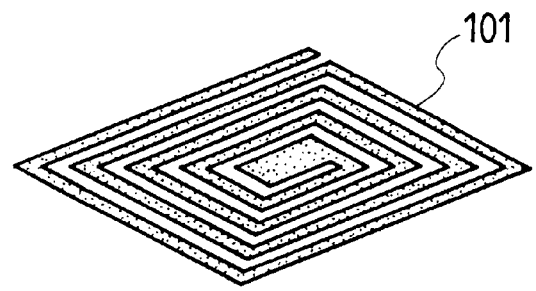
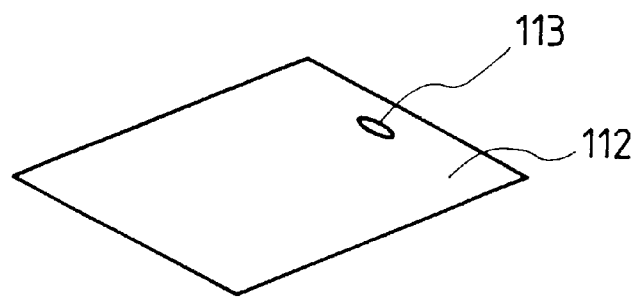
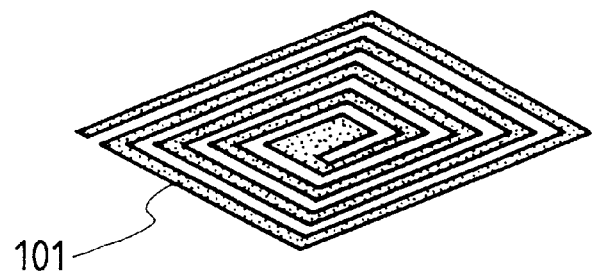
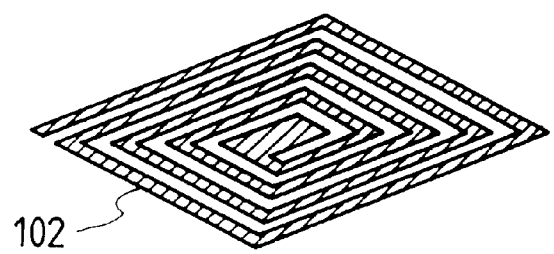

CIRCUIT-LIKE METALLIC FOIL SHEET AND THE LIKE AND PROCESSING FOR PRODUCING THEM

This application is a continuation, of application Ser. No. 08/431,691 filed Apr. 28, 1995, now abandoned and a continuation-in-part application of U.S. patent application Ser. No. 08/366,548 filed Dec. 30, 1994, now U.S. Pat. No. 5,645,932, claims priority from Japanese Applications Nos. Hei 6-323506 filed Dec. 1, 1994 and Hei 5-354105 filed Dec. 30, 1993.

BACKGROUND OF THE INVENTION

1. Field of Invention

The present invention relates to a resonant tag equipped with a resonant frequency circuit which resonates with a radio wave transmitted at a particular frequency from a detector, and also relates to processes for producing resonant tag and for fabricating a circuit-like metallic foil sheet for a resonant tag and the like.

2. Description of Prior Art

As is well known, resonant tag is a tag equipped with a resonant circuit which resonates with a radio wave transmitted at a particular frequency. Thus, when the resonant tag is brought into an area in which the radio wave of the particular frequency is transmitted, the resonant tag readily reacts to operate a buzzer or an alert lamp of a detector. Thus, to avoid shoplifting, the resonant tags are attached to goods and the like in department stores, discount stores, rental shops for video tapes, compact disk (CD) shops, etc. When the payment is settled at the cashier, the resonant tag is removed from the goods or the resonant circuit of the resonant tag is destroyed. However, if a shop's item is passed through a gate equipped with a particular detector without finishing the payment, the resonant tag attached to the item activates a buzzer, a lamp, etc., to give off an alert signal.

Basically, a resonant tag is composed of a plastic film (as a dielectric), having a spiral (or a coil-shaped) circuit (hereinafter referred to as a "coil circuit") on at least one side of the film, and a circuit for use as an electrode plate of a capacitor or another coil circuit which functions also as a capacitor on the other side of the film. If necessary, the resonant tag is laminated on a sheet of a base material such as a paper.

A typical resonant tag is illustrated in FIG. 6. Referring to FIG. 6, a resonant tag comprises a plastic film 22 which functions as a dielectric, a coil circuit 23 provided with a metallic foil, and a metallic foil circuit 24 for a capacitor electrode plate. The coil circuit 23 comprises a capacitor electrode plate section 23A on one end thereof and a circuit terminal section 23B on the other end thereof. The metallic foil circuit 24 for the capacitor electrode plate also comprises a capacitor electrode plate section 24A on one end thereof and a circuit terminal section 24B on the other end thereof corresponding to the coil circuit 23. The circuit terminal sections 23B and 24B, which are formed by sandwiching the plastic film 22, are connected with each other to form a resonant circuit by destroying the layer of the plastic film 22 using a mechanical means such as pressing. A complete resonant tag is obtained in this manner.

In addition to a resonant tag above, there is also proposed a resonant tag having no capacitor electrode section formed on the end portion of the coil circuit. In the proposed structure, coil circuits are formed on both sides of a plastic film in correspondence with each other to utilize the circuit itself as the capacitor electrode plate.

A resonant circuit is composed of a resistance R, an inductance L, and a capacitance (capacity of capacitor) C. The capacitance C is formed by providing a metallic foil such as a coil circuit, on both sides of a plastic (resin) film as a dielectric, and the resistance R is provided by the metallic foil constituting the circuit. Thus, to obtain a resonant tag with a predetermined resonant frequency, the constitution of the materials should be determined as to enable a circuit with strict accuracy in dimension and tolerance.

In the light of the aforementioned circumstances, the coil circuits have been formed conventionally by using, as the base material, a plastic film (a dielectric) laminated on either or both sides thereof a metallic foil such as an aluminum foil. In the same manner as that for fabricating a printed circuit board, the metallic foil on the plastic film are patterned into the circuit by first printing the predetermined pattern using an etching-resistant ink and then etching the printed metallic foil using a chemical such as an acidic or an alkaline solution. Otherwise, the coil circuits are formed by means of photoresist etching.

However, the etching process using a chemical not only consumes time in dissolving the metallic foil, but also has problems yet to solve concerning the post treatment of the waste etching solution.

Concerning the plastic films for the dielectric, extruded films of polyethylene and the like have been used conventionally. Because extruded plastic films are under various constraints attributed to the production process subject to various conditions such as the slit width of the molding die and the extrusion pressure applied to the resin, films with limited thickness and tolerance in thickness can be obtained. More specifically, the plastic films obtained to present by extrusion molding are problematic in that a film below a certain thickness cannot be obtained, i.e., there is limitation in lower-limit under molding, and that the tolerance in thickness cannot be reduced beyond a certain limit. A plastic film thus obtained is laminated with a metallic foil by either thermal pressing the extruded film while it is in a semimolten state with a metallic foil, or adhering the extruded film with a metallic foil using an adhesive. At any rate, both methods cannot yield stably a laminate comprising a dielectric layer of uniform thickness. Furthermore, because of the inherently strong covering power of the molded plastic film, the connection between the circuits on the surface and the back of the plastic film cannot be readily formed, or the resonant circuit once established cannot be easily destroyed, i.e., deactivation of resonant frequency characteristics is hard. These are other problems in using the conventional extruded plastic films.

Prior art processes for fabricating printed circuit boards propose stamping out a thick metallic foil into a predetermined circuit pattern and adhering the resulting circuit to a substrate. This process, however, is not suitable for resonant tags and the like because a flexible board cannot be obtained from a thick metallic foil. A process for fabricating a flexible circuit proposes die stamping, which comprises adhering a metallic foil to a substrate and stamping out the metallic foil into a predetermined circuit pattern, and peeling off the metallic foil from the unnecessary portions. However, this process is disadvantageous in that it excludes the use of a metallic foil not strong enough for the peeling off, and that the peeling efficiency is greatly impaired if unnecessary portion is discontinuous.

SUMMARY OF THE INVENTION

Accordingly, an object of the present invention is to overcome the aforementioned problems in prior art, and to provide, by a simple fabrication process, a resonant tag having a stable resonant frequency characteristics.

Another object of the present invention is to provide, with high efficiency and without utilizing an etching process, a resonant tag having a stable resonant frequency characteristics and a circuit-like metallic foil for use in circuit boards of various types of electric appliances, heaters, etc., in which a wiring circuit similar to that used in resonant tag is used.

BRIEF DESCRIPTION OF THE DRAWINGS

FIG. 8 is a perspective view of a fabrication apparatus for use in a process according to an embodiment of the present invention;

FIG. 16 is an exploded perspective view of a resonant tag according to yet other embodiment of the present invention.

DETAILED DESCRIPTION OF THE INVENTION

Figure 1:
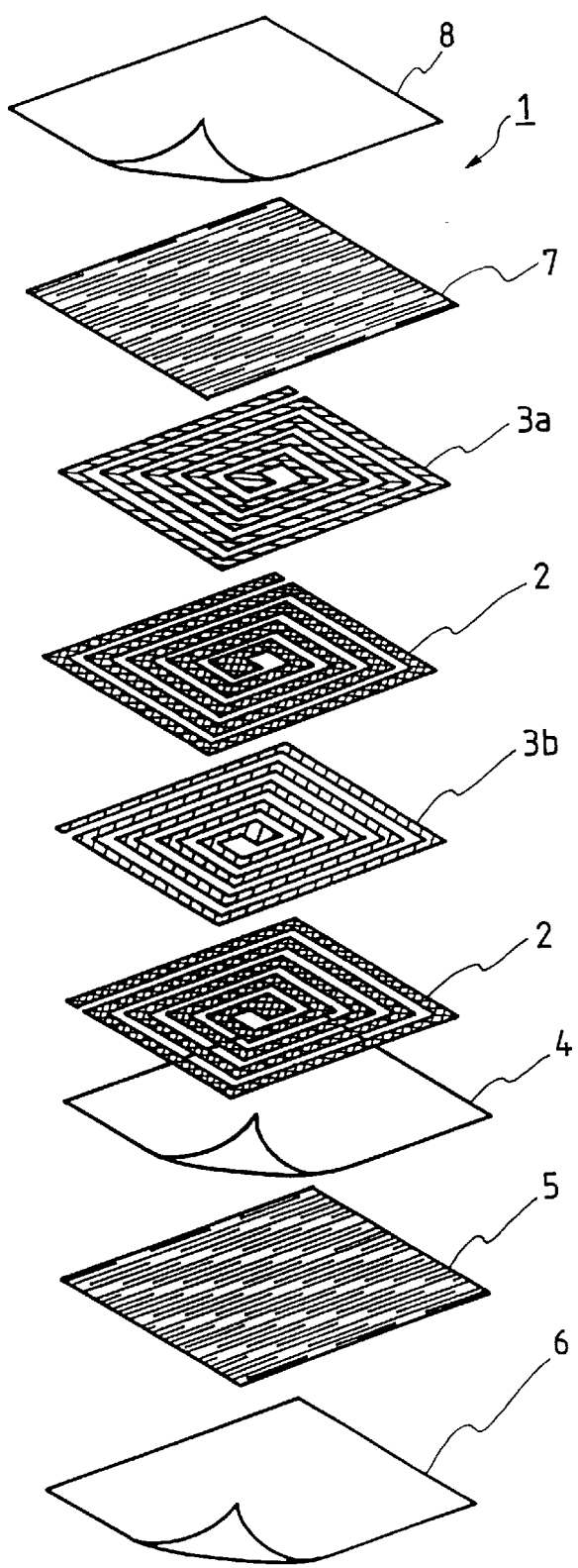
FIG. 1 is an exploded perspective view of a resonant tag according to an embodiment of the present invention.

As a result of extensive and intensive study, the present inventor has found that a dielectric layer of a desired thickness can be obtained by a coating process utilizing a liquid resin instead of the conventional molded resin film and by adhering a metallic foil circuit using said coated resin (film) as the adhesive. The present invention has been accomplished based on the above findings which enable a resonant tag having excellent resonant frequency characteristics.

Accordingly, a resonant tag according to the present invention is characterized in that a circuit-like (coil-like) metallic foil is adhered to either side or both sides of a dielectric resin film formed by a coating process.

The dielectric resin film for use in the present invention may be formed like a coil in the same shape as that of the coil-like metallic foil, or it may be a resin film having approximately the same area and shape defined by the outer periphery of the coil-like metallic foil.

More specifically, for example, a resin coating may be formed first on one side of the metallic foil, and then stamping out the resin-coated metallic foil into a coil-like shape. In this manner, a coil-shaped resin film having the same shape as that of the coil-like metallic foil can be fabricated. Otherwise, the resonant tag can be fabricated by a process which comprises preparing a resin film by applying a liquid resin to the surface of a release paper and the like to form a resin film; adhering a coil-like metallic foil to the surface of the resulting resin film; peeling off the release paper from the resin film; and adhering the coil-like metallic foil at the back side to the resin film on the side from which the release paper is peeled off. Furthermore, a resin film can be formed by applying a liquid resin to the surface of a release paper on which a coil-like metallic foil is superposed, and further adhering a coil-like metallic foil on the resin film.

The liquid resin for use in the present invention in itself is of liquid, i.e., may be a solvent-free liquid resin such as an epoxy resin, or a resin solution which is dissolved in a solvent. Any resin suitable for use in a coating process and having excellent dielectric properties can be used. Specifically mentioned are, for instance, polyolefin. Preferably, the resin film thus obtained functions as an adhesive in adhering a metallic foil to the resin film. Accordingly, more preferred is a resin of having thermal adhesion properties. A filler and the like which improves or increases the dielectric properties of the resulting film can be incorporated into the resin film.

The resin film can be formed on either of the sides of the coil-like metallic foil or on both sides thereof. Moreover, two or more coil-like metallic foils having a resin film on at least one side thereof may be superposed and adhered to each other. In such a case, the metallic foils in each of the layers are connected by a proper means to obtain the desired resonant frequency characteristics.

The resin film for use in the present invention can be formed by applying the liquid resin over the entire surface by using roll coating, or by applying to predetermined portions to provide a coated pattern by means of gravure printing, silk screen printing, etc. Otherwise, color printing process may be employed to apply a liquid resin containing a conductive filler such as a metallic powder and the like to a part of the metallic foil circuit. The resulting resin film may be used for connecting the coil-like metallic foil provided on both the surface and the back of dielectric resin film to form the desired resonant circuit. Furthermore, the resin film containing the electrically conductive filler may be utilized to facilitate the destruction of the resonant circuit.

Finally, a desired resonant tag can be fabricated by adhering a support or a decorative sheet such as a paper, a plastic film, or a plastic sheet by an ordinary method to at least one surface of the base for the resonant tag obtained by adhering coil-like metallic foils to the both sides of the resin film to provide a resonant circuit according to the process described in the foregoing.

For instance, a resonant tag can be obtained by adhering a paper or a plastic film to one side of the base for the resonant tag obtained above; applying an adhesive to the other side of the base; and further adhering a release paper to the upper side of the base having thereon the adhesive. The resulting resonant tag comprises a release paper so that the resonant tag can be directly adhered to goods by simply peeling off the release paper.

In case of conventional resonant tags using a non-adhesive film such as a polyethylene film as the dielectric, the support has to be attached to the dielectric using an adhesion adhesive. However, the resonant tag according to the present invention can be implemented using an ordinary adhesive, because it uses a resin film as the dielectric.

The process according to the present invention for fabricating a circuit-like metallic foil sheet such as a resonant tag is characterized in that it uses a laminate comprising a carrier sheet such as a paper or a plastic film adhered thereto a metallic foil as the base material, and that it comprises forming, with notch, a predetermined circuit-like pattern in the metallic foil of said laminate using a stamping die; disposing the surface of a support such as a plastic film and the like opposed to the side of said laminate having thereon the metallic foil; and transferring the circuit-like metallic foil to the surface of the support by heating said circuit-like patterned portion from the carrier sheet side of said laminate or from the support side.

In the process according to the present invention, the carrier sheet is adhered to the metallic foil using an easily removable adhesive so that the metallic foil can be readily peeled off from the carrier sheet upon transferring the stamped metallic foil to the surface of the support. In particular, the use of an adhesive the adhesion force of which decreases when heated is preferred, because the stamped-out portion alone is transferred to the support by heating. By thus using the particularly preferred adhesive of the type above, the adhesion force of the heated portion can be lowered as compared to that of the unheated portions, thereby facilitating the pattern transfer of the heated portion to the support.

Particularly preferred adhesives satisfying the demand above include a pressure sensitive adhesive (or adhesion adhesive) into which a curing agent that accelerates curing upon heating is added. Also usable in addition to the adhesive above are adhesive compositions based on a pressure sensitive adhesive and comprising dispersed therein a thermosetting resin such as an epoxy resin or a polyamide resin. The adhesion power of the adhesive compositions of this type decreases upon heating due to the setting of the resin. Otherwise, adhesive compositions based on an adhesive and containing further therein an oil and fat or a wax can be used. The oil and fat or the wax blended with the adhesive precipitates on the adhesion is separated out on the adhesive face upon heating to suppress the adhesion force of the adhesive.

In general, a thermal adhesive resin film is provided to the surface of the metal foil of the laminate composed of a carrier sheet and a metallic foil so that the stamped metallic foil can be transferred to the support in the later process steps by thus providing the adhesive to the surface thereof. However, this step can be omitted in case a thermal adhesive resin film or a film surface-coated with a thermal adhesive resin is used for the support itself.

The carrier sheet to be used in the present invention should be sufficiently thick so that it may not be simultaneously stamped out when the metallic foil is stamped out into a predetermined circuit-like pattern by stamping. It should be of a proper thickness, however, so that the metallic foil adhered thereto would not break in case the rolled laminate is unrolled for the continuous processing thereof. Usable as the carrier sheets include a sufficiently thick and strong paper such as fine paper (slick paper) or parchment paper, and a plastic film such as a polyethylene film, polypropylene film, or a polyester film. Among them, paper is preferred from the viewpoint of, for example, heat transfer properties upon hot image transfer, ease in handling, and cost.

The metallic foil for use in the present invention is not particularly limited, and usable are, for example, a copper foil, an aluminum foil, or a stainless steel foil. Moreover, a thin soft aluminum foil, a foil conventionally believed unsuitable for this type of application, can be used advantageously in the present invention. Metallic foils from several microns ($\mu$m) to several hundred microns ($\mu$m) can be used in the present invention. More specifically, however, a foil from 3 to 150 $\mu$m in thickness is preferred. In case of aluminum foils, those from 10 to 60 $\mu$m in thickness are preferred.

Stamping techniques conventionally known in the art of manufacturing labels and cans can be readily utilized for forming, with notch, the predetermined circuit-like pattern in the metallic foil alone, i.e., half-cutting method.

The laminate of the metallic foil which is stamped out into the circuit-like pattern by stamping is transferred to the support first by using a hot mold having a heating protrusion patterned into approximately the same shape as that of the stamped-out circuit-like pattern, or by heating and applying pressure to the surface of the carrier sheet of the laminate using a heat sealer and the like. Then, when the laminate is peeled off from the support, the metallic foil stamped out into a circuit-like pattern remaining on the support by the thermal adhesion, and the unnecessary portion is removed together with the laminate. Once the circuit-like metallic foil is transferred to the support, the adhesion of the metallic foil to the support is preferably assured, for example, by further heating and applying pressure to the entire structure if necessary. In case the support is heated after the metallic foil is transferred, the heating pattern need not be of the same width as that of the stamped out metallic foil, and, it may be, for example, narrower than that of the metallic foil.

In the heating step for transferring the circuit-like metallic foil to the support, the heat may be applied from the support side if a thin sheet such as a paper or a plastic film is used as the support. Otherwise, the heat may be applied from both sides of the carrier sheet and the support.

In fabricating a resonant tag by the process according to the present invention, a dielectric plastic film or a dielectric resin film is used as the support. The circuit-like metallic foil is transferred to each of the sides of the dielectric support using the above process to form a circuit or a capacitor section on both sides of the support. In this manner, a resonant circuit is established to provide the base for the resonant tag.

In case of using a resin film as the support, a resin coating is prepared by, for example, applying a predetermined liquid resin to a release paper. The resin film on the release paper is then used as the support to transfer thereon the circuit-like metallic foil. The release paper is peeled off thereafter and another circuit-like metallic foil can thus be transferred thereafter to the face of the metallic foil applied resin film in which the peeling-off is done, i.e., the peeled-off face, to obtain a base for the resonant tag.

The resins for use as the dielectric plastic film or the dielectric resin film include those conventionally used in this field. Specifically mentioned are films or resin paints such as polyethylene, polypropylene, polystyrene, polyester, etc. Furthermore, heat-resistant products can be fabricated using heat-resistant resins such as polyimide for the support.

Preferably, a hole or a cutting is provided previously to the support, i.e., the dielectric plastic film or the dielectric resin film, to connect the metallic foil circuits formed on the surface and the back of the support or to facilitate the destruction of the resonant circuit by applying current in case of need. The hole or the cutting is provided at a position in the support where the metallic foil on the surface is superposed on the metallic foil on the back. The electric energy necessary for deactivating the resonant state can be controlled by adjusting the position at which the hole or the cutting is provided. Moreover, the hole or the cutting can be used for connecting the circuits provided on the upper and the lower sides of a multi-layered printed circuit board.

In fabricating a resonant tag, there is no particular limitation for the thermal adhesive resin to be applied to the surface of the metallic foil. Accordingly, any type of resin suitable for coating and having excellent dielectric characteristics, such as polyolefin, can be used. In addition, a filler and the like which improves or increases the dielectric properties of the resulting film can be incorporated into the resin film if desired. Furthermore, if necessary, a dielectric plastic film may be laminated onto the surface of the metallic foil in the laminate, and the dielectric plastic film may be further coated with a thermal adhesive resin. In this case, the metal foil in the laminate is stamped out together with the plastic film so that it may be transferred to the support.

Otherwise, in the process according to the present invention, the base for the resonant tag can be fabricated by subjecting the laminates each having thereon a metal foil stamped out into the circuit-like pattern to heating under pressure without using a support. The thermal adhesive resin applied to the surface of the metallic foils serve as the support. Accordingly, the laminates are disposed in such a manner that the side having thereon the metallic foil may face each other, and heat is applied from the side of the carrier sheets. Similar to the case described above, a dielectric resin is used as the resin of the thermal adhesive resin film. It is also possible to provide the thermal adhesive resin to the metallic foil of the first laminate alone while applying no resin film to the metallic foil in the second laminate. Furthermore, a simple thermal adhesive resin film can be applied to the metallic foil of the first laminate while applying a dielectric resin film to the metallic foil of the second laminate. The resulting two laminates are then joined to provide a base for the resonant tag as an integrated body.

The base for the resonant tag thus obtained by adhering coil-like metallic foils as the resonant circuit to the both surfaces of the resin film can be finished into a desired product. A desired resonant tag or a resonant label can be implemented by adhering a reinforcing member or a decorative sheet such as a paper, a plastic film, or a sheet to at least one side of the resulting base for the resonant tag.

For instance, a paper or a plastic film may be adhered to one side of the base for the resonant tag using an adhesive, while applying an adhesion adhesive to the other side and attaching thereto a release paper. A resonant tag directly applicable to goods by peeling off the release paper can be obtained in this manner.

Thus, because a coating process of a liquid resin is employed for fabricating a dielectric film is employed, the present invention provides a resonant tag comprising a dielectric film far superior to the conventional plastic films fabricated by extrusion molding concerning tolerance in film thickness. Furthermore, by using the resin film directly as an adhesive, the fluctuation in thickness of the dielectric layer in conventional resonant tags attributed to the plastic film being adhered using an adhesive can be eliminated. Moreover, a wider selection for a resin is allowed, and a filler and the like for improving the dielectric characteristics of the resin film can be added in the resin at a desired concentration. It is also possible to blend two or more types of resins as desired. Accordingly, a resonant tag improved in resonant frequency characteristics or a resonant tag having the desired flexibility is made available.

Furthermore, the operation of stamping out the metallic foil into a coil-like shape in the present invention is also facilitated, because the resin film is formed on at least one side of the metallic foil.

Moreover, the process according to the present invention comprises using a laminate as a base material comprising a carrier sheet having adhered thereon a metallic foil, so that the metallic foil alone can be stamped out into a desired pattern, and that the stamped-out portion can be transferred to the support by heating and applying pressure from the carrier sheet side or the support side. Comparing with the conventional process of die stamping, it can be seen that the process according to the present invention allows a desired circuit pattern to be formed even on a thin and soft metallic foil. The process according to the present invention furthermore enables the formation of concentric patterns composed of large and small circles in addition to the continuous coil-like patterns generally used in the prior art processes.

In case of using a paper for the carrier sheet, a mark for aligning the carrier sheets may be formed. By using this mark, the metallic foil circuits can be formed easily on both the surface and the back of the support in a superposed arrangement. Thus, a resonant tag comprising a capacitor consisting of a dielectric film interposed between two facing metallic foil circuits can be readily implemented.

In case a laminate comprising a metallic foil surface-coated with a thermal adhesive resin film is used as the dielectric layer in the present invention, the dielectric layer is established by the coating of a liquid resin. Thus, the resulting dielectric film is far superior to the conventional plastic films fabricated by extrusion molding concerning tolerance in film thickness. Accordingly, a resonance tag improved in resonant frequency characteristics and in flexibility is made available.

EXAMPLE 1

FIG. 1 shows an exploded perspective view of a resonant tag according to an embodiment of the present invention, in which a resin film 2 being provided as a dielectric layer is formed in the same shape as that of an aluminum foil 3a stamped out into a coil-like shape. Referring to FIG. 1, the resin film 2 is disposed far apart from the aluminum foil 3a.

However, in practice, a liquid resin is applied to the aluminum foil and stamped together with the aluminum foil 3a. Accordingly, the resin film 2 is integrated with the surface of the aluminum foil 3a to provide a monolithic body.

Referring to FIG. 1, a coil-like aluminum foil 3b is superposed on the aluminum foil 3a and adhered to the resin film 2 in such a manner that the coiling direction thereof is reversed with respect to the coiling direction of the aluminum foil 3a. In case a thermal resin is used for the resin film 2, the aluminum foil 3a is superposed on the aluminum foil 3b, or a support 4 is further optionally superposed thereon, and the resulting laminate is subjected to hot contact bonding. Specifically in the present example, a resin film 2 is also formed to the aluminum foil 3b in the same manner as in aluminum foil 3a, and a support 4, e.g., a paper or a plastic film, is laminated on the lower surface thereof. A release paper 6 is adhered to the support 4 by interposing an adhesion adhesive 5 therebetween. On the other hand, a paper 8 is adhered to the upper surface of the aluminum foil 3a using an adhesion adhesive or an adhesive 7 to obtain the desired resonant tag 1.

The paper 8 is provided to protect or to hide the resonant circuit thereunder. Accordingly, the paper is provided with a printing as a label indicating, for instance, a trade name, a distributor, or an advertising phrase.

Figure 2:
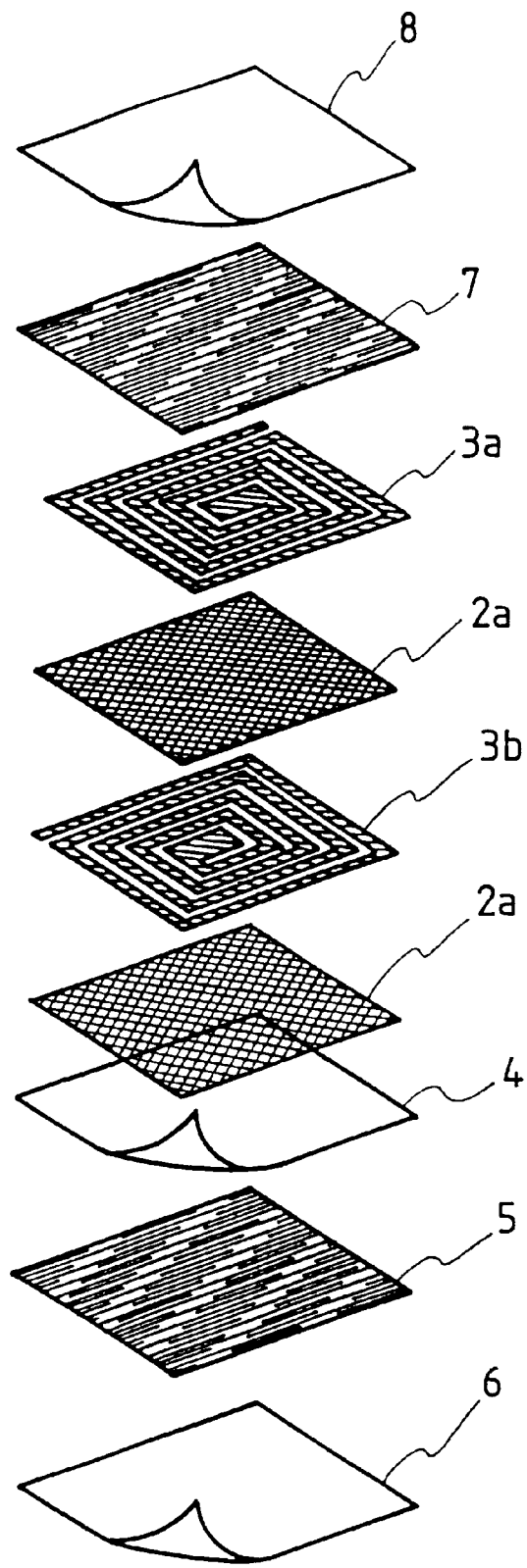
FIG. 2 is an exploded perspective view of a resonant tag according to another embodiment of the present invention.

FIG. 2 shows an exploded perspective view of a resonant tag according to another embodiment of the present invention, in which a resin film 2a is provided at the same area as that of a shape defined by the outer periphery of the coil-like aluminum foil 3a. The other constitution of the resonant tag is the same as that of a structure illustrated in FIG. 1. Accordingly, the explanation for the same members as those illustrated in FIG. 1 is omitted by attaching the same symbols thereto. In the present example, the resin film 2a is shown as a planar film. However, a liquid resin may be applied to the entire surface of the coil-like aluminum foil to form a film. Accordingly, a shape comprising a resin film between the aluminum foil coils can be implemented. More specifically, a coil-like protrusion can be formed on a flat plane. In this manner, the insulation of the aluminum foils formed on both the surface and the back of the resin film can be further assured.

Figure 3:
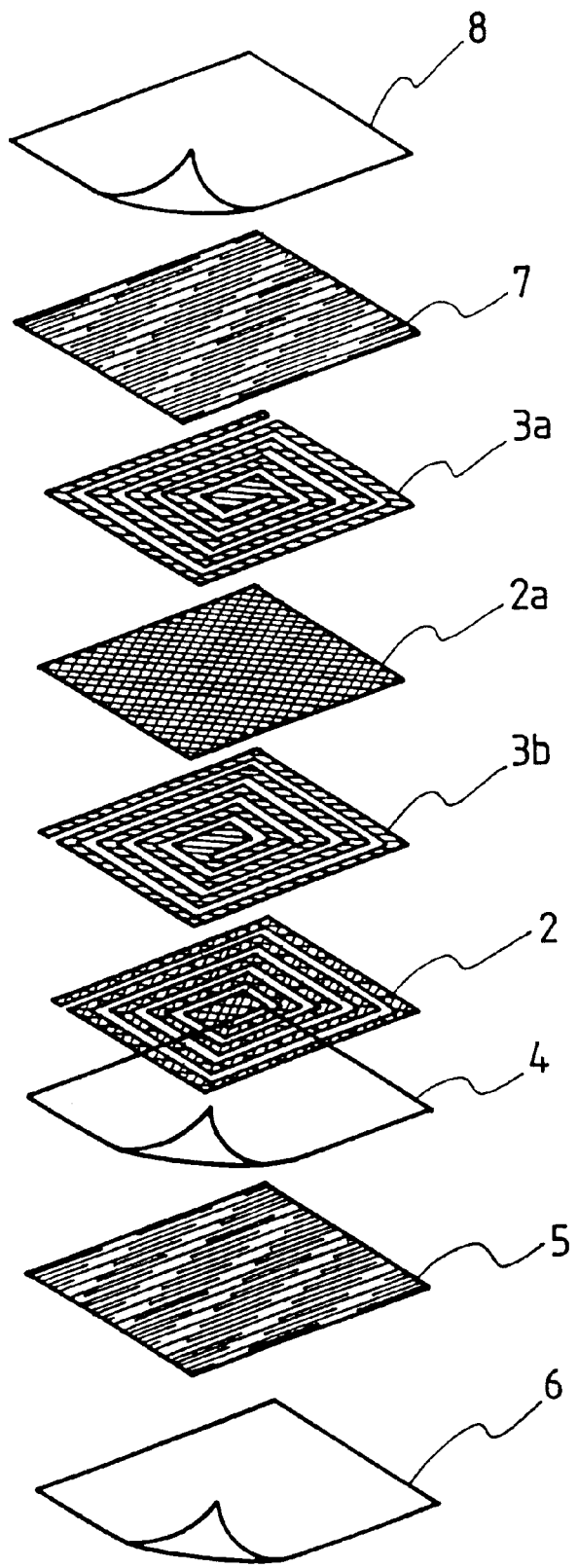
FIG. 3 is an exploded perspective view of a resonant tag according to a still other embodiment of the present invention.

FIG. 3 shows an exploded perspective view of a resonant tag according to a still other embodiment of the present invention, in which a coil-like resin film 2 is provided together with a planar resin film 2a. In case a plastic film 4 is used as the support, a coil-like aluminum foil 3b having the coil-like resin film 2 provided on one side thereof is adhered first to the plastic film using the resin film 2. Then, a resin film 2a can be formed by applying a liquid resin to the entire surface (inclusive of the surface of the support 4 which is seen through the coil) of the aluminum foil 3b having no resin film 2 thereon.

Figure 4:
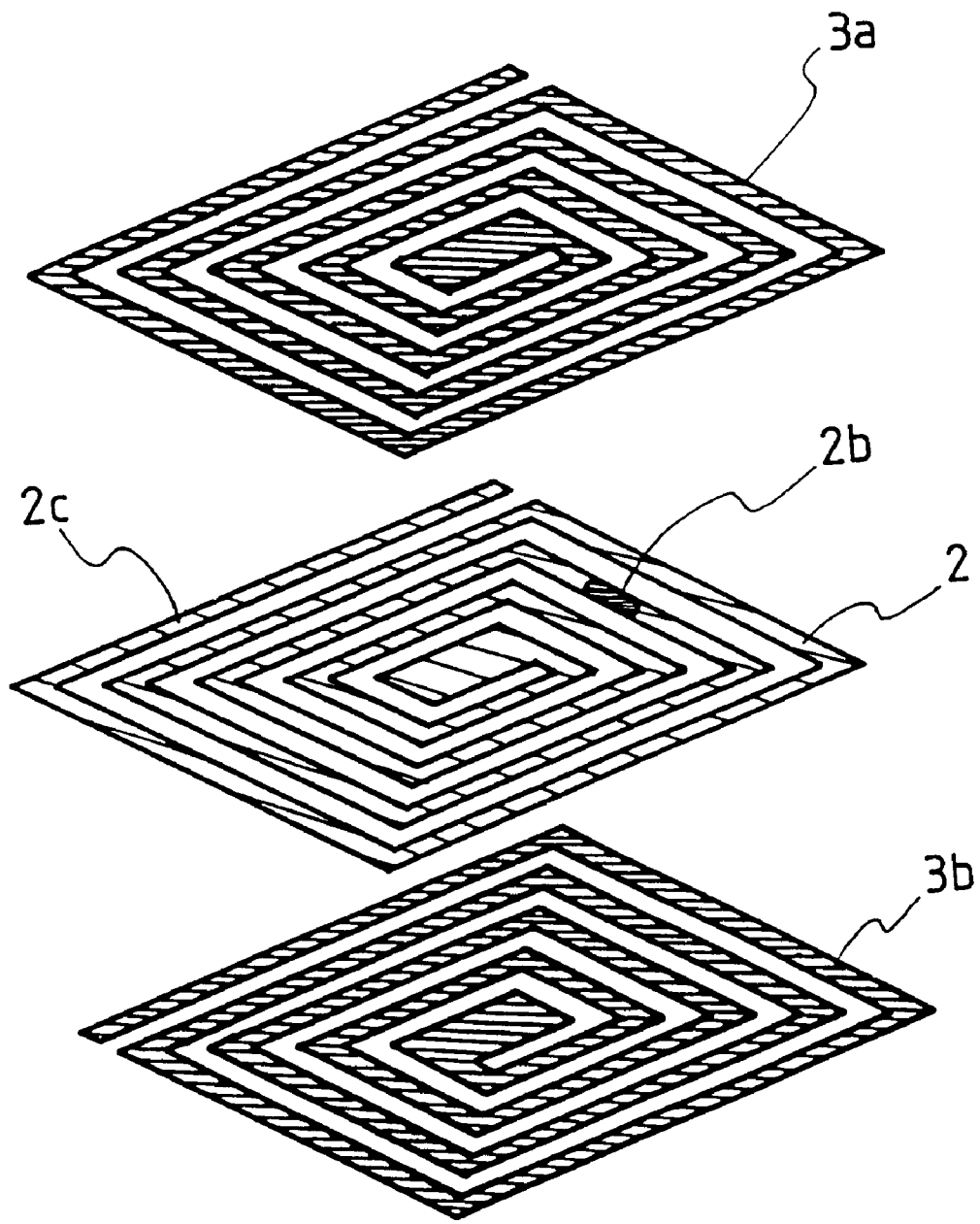
FIG. 4 is a perspective view of a resonant tag according to a yet other embodiment of the present invention, in which an electrically conductive resin film is partially provided to the resin film.

FIG. 4 shows a perspective view of a resonant tag according to a yet other embodiment of the present invention, in which an electrically conductive or a semiconductive resin film 2b mixed therein an electrically conductive material (e.g., an aluminum powder or a copper powder) is formed in the midway of the resin film 2 by means of color printing. The conductive resin film is provided in the midway of the aluminum foil circuit in this example, however, a conductive resin film can be provided linearly in the outermost portion 2c of the coil as a connection point to provide a current path between the metallic foils laminated on the surface and the back of the resin film 2.

Figure 5:
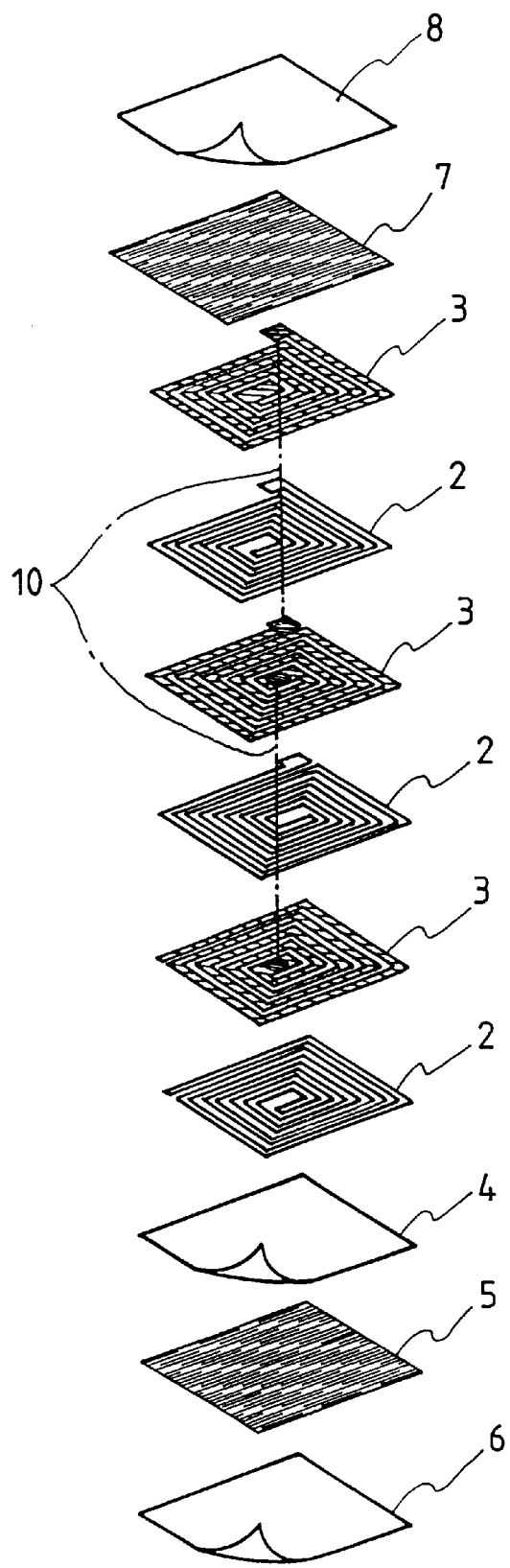
FIG. 5 is an exploded perspective view of a resonant tag according to an embodiment of the present invention, in which a plurality of coil-like metallic foils are laminated.
Figure 6:
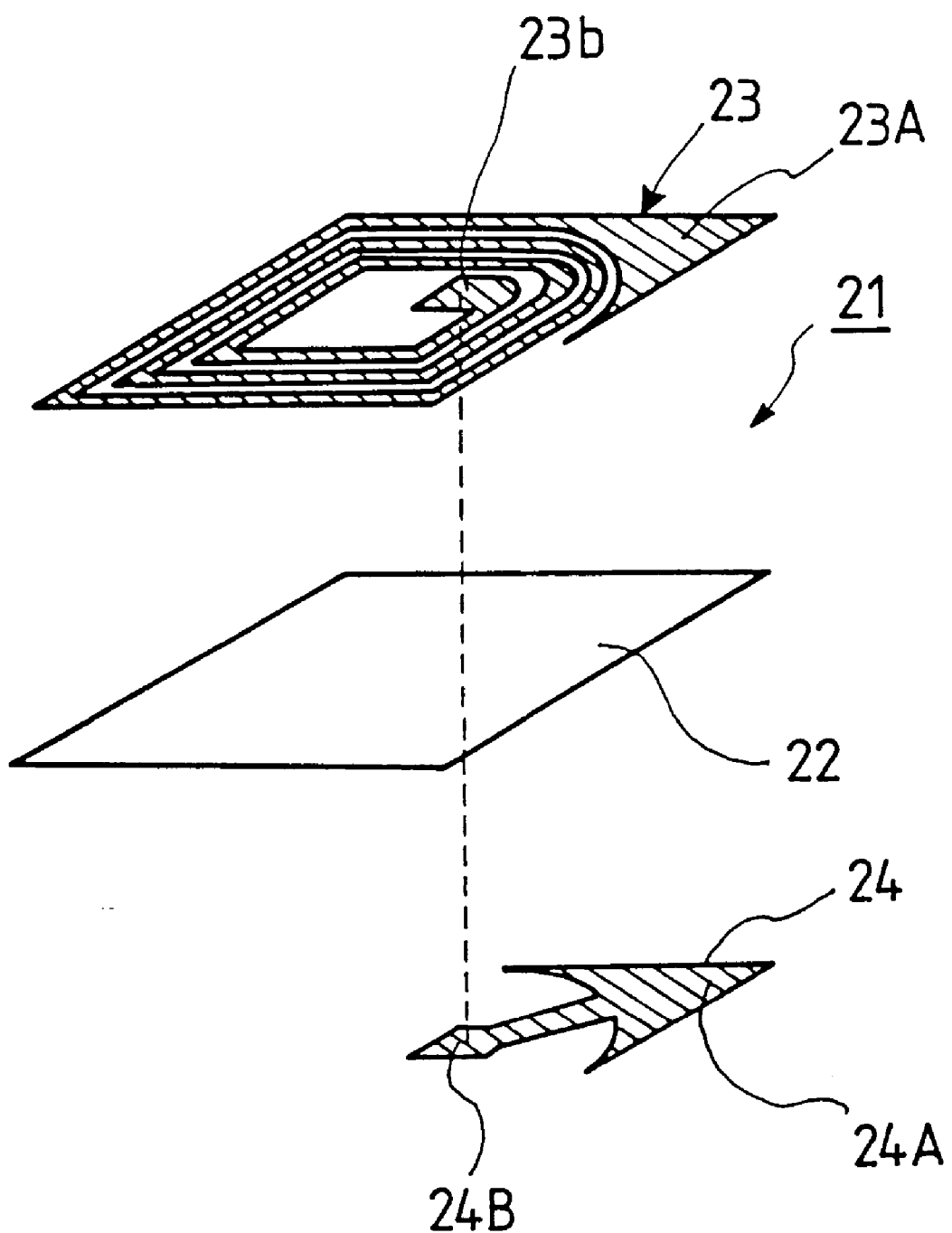
FIG. 6 is an exploded perspective view of a prior art resonant tag.

FIG. 5 is an exploded perspective view of a resonant tag according to an embodiment of the present invention, in which a plurality of coil-like aluminum foils each having thereon a resin film are laminated. More specifically in the present example, three aluminum foils 3 are laminated. In FIG. 5, a reference numeral 10 shows a position at which the upper and the lower aluminum foils are connected. A further compact resonant tag having a predetermined resonant characteristics can be implemented by thus joining a plurality of foils.

EXAMPLE 2

Figure 7A:
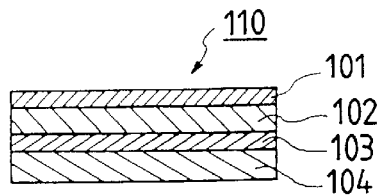
FIGS. 7A to 7G are a schematically drawn diagram showing the cross section views of the step sequential members obtained during the fabrication of a resonant tag, which is provided as an explanatory means for a process according to an embodiment of the present invention.

FIGS. 7A to 7G are a schematically drawn diagram showing the cross-sectional view of the step sequential members obtained during the fabrication process of a resonant tag, which is provided as an explanatory means for a process according to an embodiment of the present invention. In FIG. 7A, a metallic foil 102 surface-coated with a thermal adhesive resin film 101 is adhered to a carrier sheet 104 using a pressure-sensitive adhesive or an adhesion adhesive 103 to provide a laminate as the base for the resonant tag.

Figure 7B:
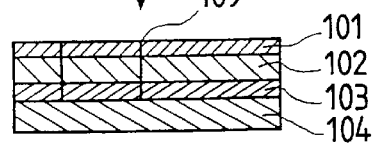
Figure 7C:
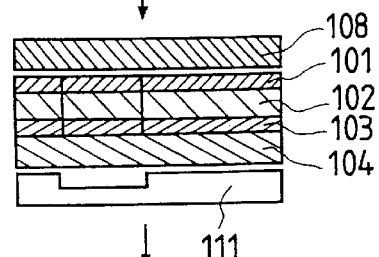
Figure 7D:
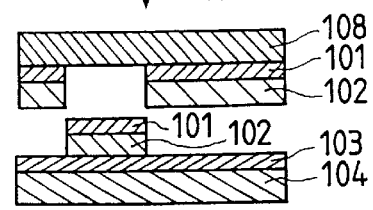
Figure 7E:
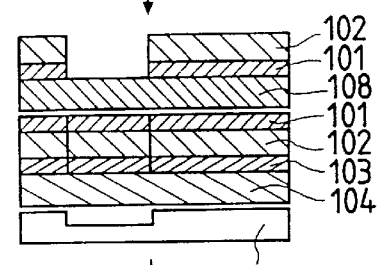
Figure 7F:
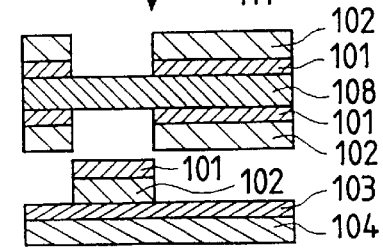
Figure 7G:
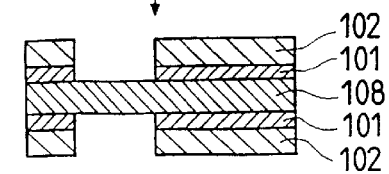

Referring to FIG. 7B, the laminate 110 is subjected to stamping to form a notch 109 to the metallic foil 102. The resulting laminate 110 is then superposed on a support (a plastic film) 108 and the notched portion is heat-contacted by using a mold 111 (FIG. 7C). Upon peeling off the laminate 110, the metallic foil 102 of the heated circuit pattern alone is transferred to the support 108 (FIG. 7D). After thus providing a circuit-like metallic foil 102 on the surface of the support 108, the same operation is repeated to the back thereof to establish a circuit-like metallic foil 102 on both surfaces of the support 108. Thus is obtained a base for the resonant tag (FIGS. 7E to 7G).

FIG. 8 is a perspective view of a fabrication apparatus for use in the continuous operation of the process described above.

Referring to FIG. 8, a laminate 150 supplied in the form of a roll is rewound and fed to a first cutting press 160 for stamping out the metallic foil. The metallic foil is stamped out together with a support 151 so that it may be transferred to the support 151 by using the first heating press 161. The combined laminate 150 and the support 151 is separated at the reverse roll 167. The unnecessary laminate 152 is taken up, while a support 151a having thereon the metallic foil circuit is further subjected to pressing under heat by using a first heat setting press 162.

Figure 9:
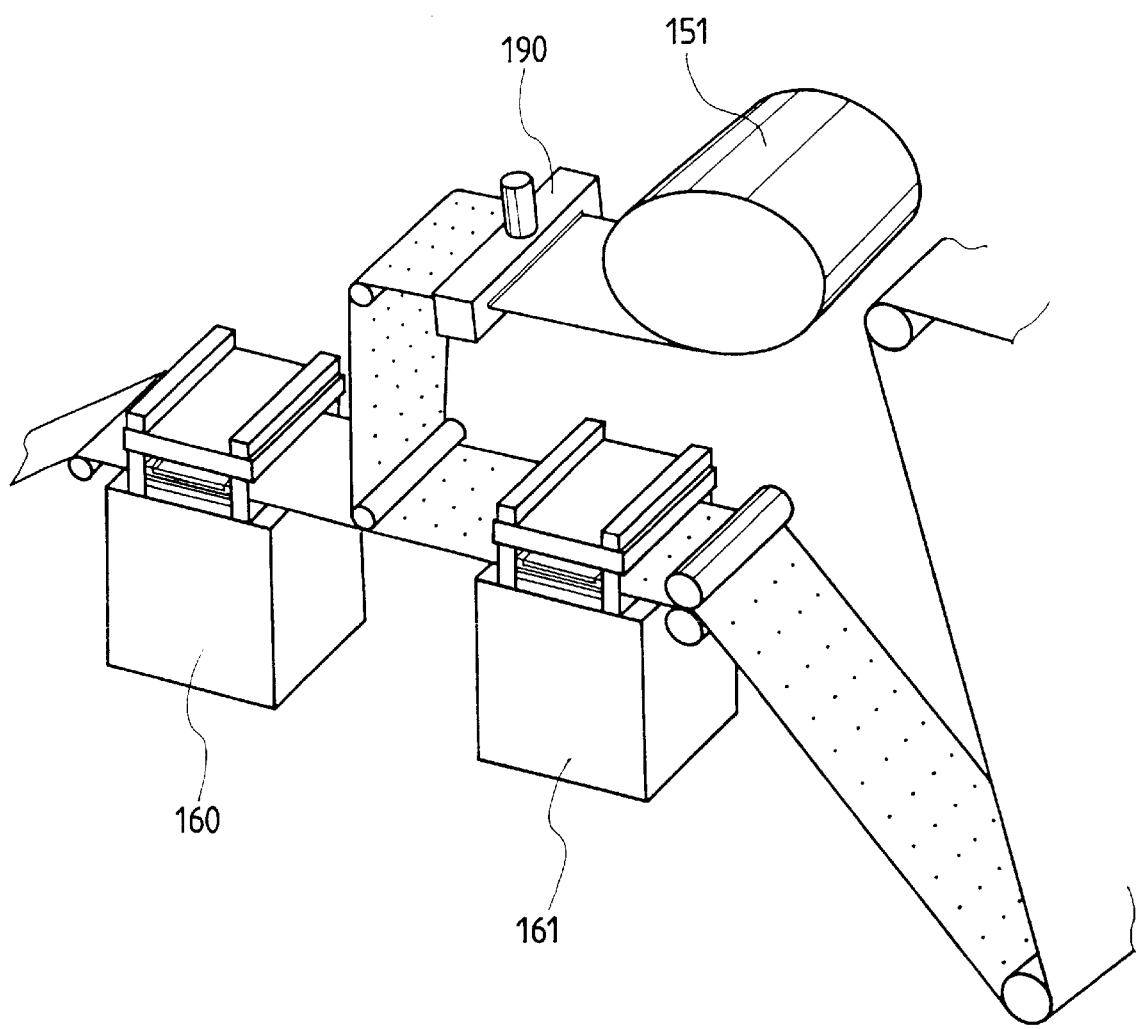
FIG. 9 is a perspective view of a part of the fabrication apparatus illustrated in FIG. 8, showing an application of the apparatus.

The first cutting press 160 for use in stamping out the metallic foil and the portion for transferring the metallic foil to the support 151 using the first heating press 161 are illustrated in FIG. 9. Referring to FIG. 9, there is also shown a perforating apparatus 190 for boring a hole (reference can be made to FIG. 16) in the support 151 (in a case that the support is a dielectric film) for use in connecting the metallic foil circuit on the surface of the dielectric film with that on the back of the film.

Turning to FIG. 8, the support 151a provided with a metallic foil circuit over one surface thereof is then reversed by the reverse roll 168. The back of the support 151a is combined to a laminate 150 which is rewound from a rolled laminate 150 shown in the right hand side of FIG. 8, and is transferred with a metallic foil in the same manner as described above using a second cutting press 163. In this manner, the support 151a together with the laminate 150 is passed through a second heating press 164 and a second heat setting press 165 to provide a final product 153 having a metallic foil circuit on the surface and the back of the support 151a.

If necessary, a printed paper is attached, an adhesion adhesive is applied, or a release paper is laminated to the product thus obtained to obtain a resonant tag or a resonant label.

EXAMPLE 3

FIGS. 10A to 10G are a schematically drawn flow diagram showing the cross section views of the step sequential members obtained during the fabrication process of a resonant tag, which is provided as an explanatory means for a process according to another embodiment of the present invention. The process steps illustrated in FIGS. 10A to 10D are the same as those described in Example 2 with reference to FIGS. 7A to 7D. A circuit-like metallic foil 102 is provided on one side of the support 107, and a laminate 110 having provided previously thereon a metallic foil 102 by stamping is superposed on the upper side of the metallic foil 102 provided on the support 107. The entire structure is then subjected to heating under pressure to form another circuit-like metallic foil 102 on the surface of the previously established circuit-like metallic foil 102.

The support 107 of the base for a resonant label thus obtained is coated with a pressure sensitive adhesive (adhesion adhesive) 106 for use in adhering the resonant label, and a release paper 105 is attached to the surface covered on the adhesion-adhesive coated label to finally obtain a resonant label.

Figure 11:
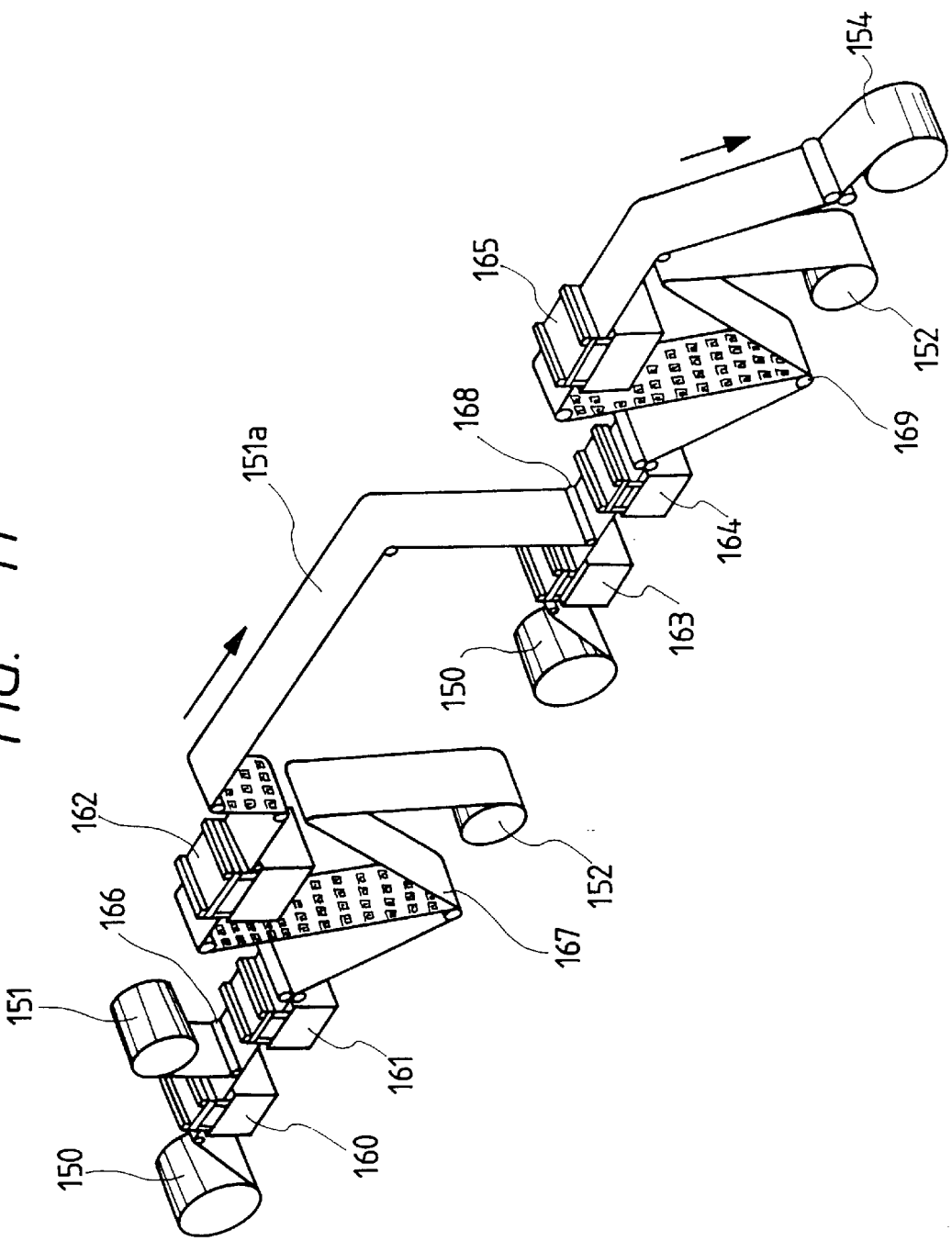
FIG. 11 is a perspective view of another fabrication apparatus for use in a process according to another embodiment of the present invention.

FIG. 11 is a perspective view of a fabrication apparatus for use in the continuous operation of the process described above.

Figure 10A:
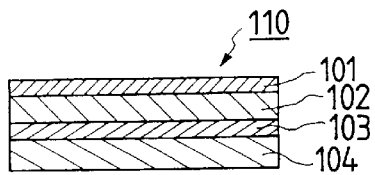
FIGS. 10A to 10G are a schematically drawn diagram showing the cross section views of the step sequential members, provided as an explanatory means for a process according to another embodiment of the present invention.
Figure 10B:
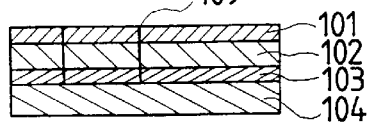
Figure 10C:
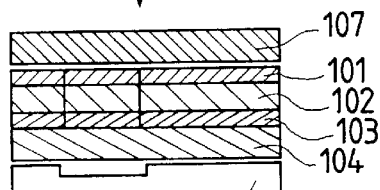
Figure 10D:
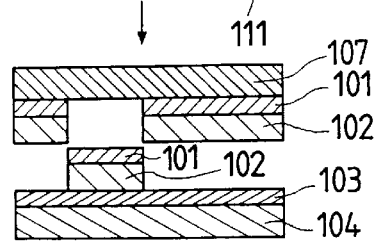
Figure 10E:
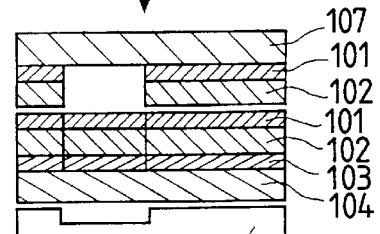
Figure 10F:
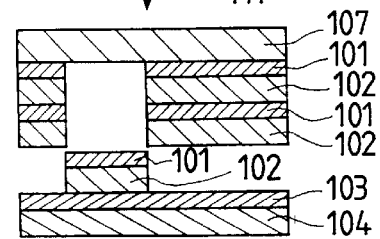
Figure 10G:
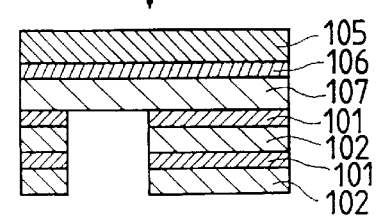

Similar to the process described in Example 2 with reference to FIG. 8, a laminate 150 supplied in the form of a roll is rewound and fed to a first cutting press 160 for stamping out the metallic foil. The metallic foil is stamped out together with a support 151 so that it may be transferred to the support 151 by using the first heating press 161. The combined laminate 150 and support 151 are separated at the reverse roll 167. The unnecessary laminate 152 is taken up, while the support 151a having thereon the metallic foil circuit is further subjected to pressing under heating by using a first heat setting press 162. The process of the present example is, however, different from that with reference to FIG. 8. More specifically, the support 151a having the metallic foil circuit on one face thereof is fed to the next step without being reversed by the roll 168. The support 151a is assembled with a laminate 150 rewound from the rolled laminate 150 placed on the center of the apparatus. The laminate 150 has thereon a stamped metallic foil provided in the same manner as that in Example 2 using a second cutting press 163. The resulting structure comprising the support 151a and the laminate 150 is passed through a second heating press 164 and the second heat setting press 165 to finally obtain a product 154 having a second metallic foil circuit on the metallic foil circuit previously provided on the support. A resonance label as illustrated in FIG. 10G is finally obtained by applying an adhesion adhesive to the support of the product obtained above, and further adhering thereto a release paper.

EXAMPLE 4

Figure 12:
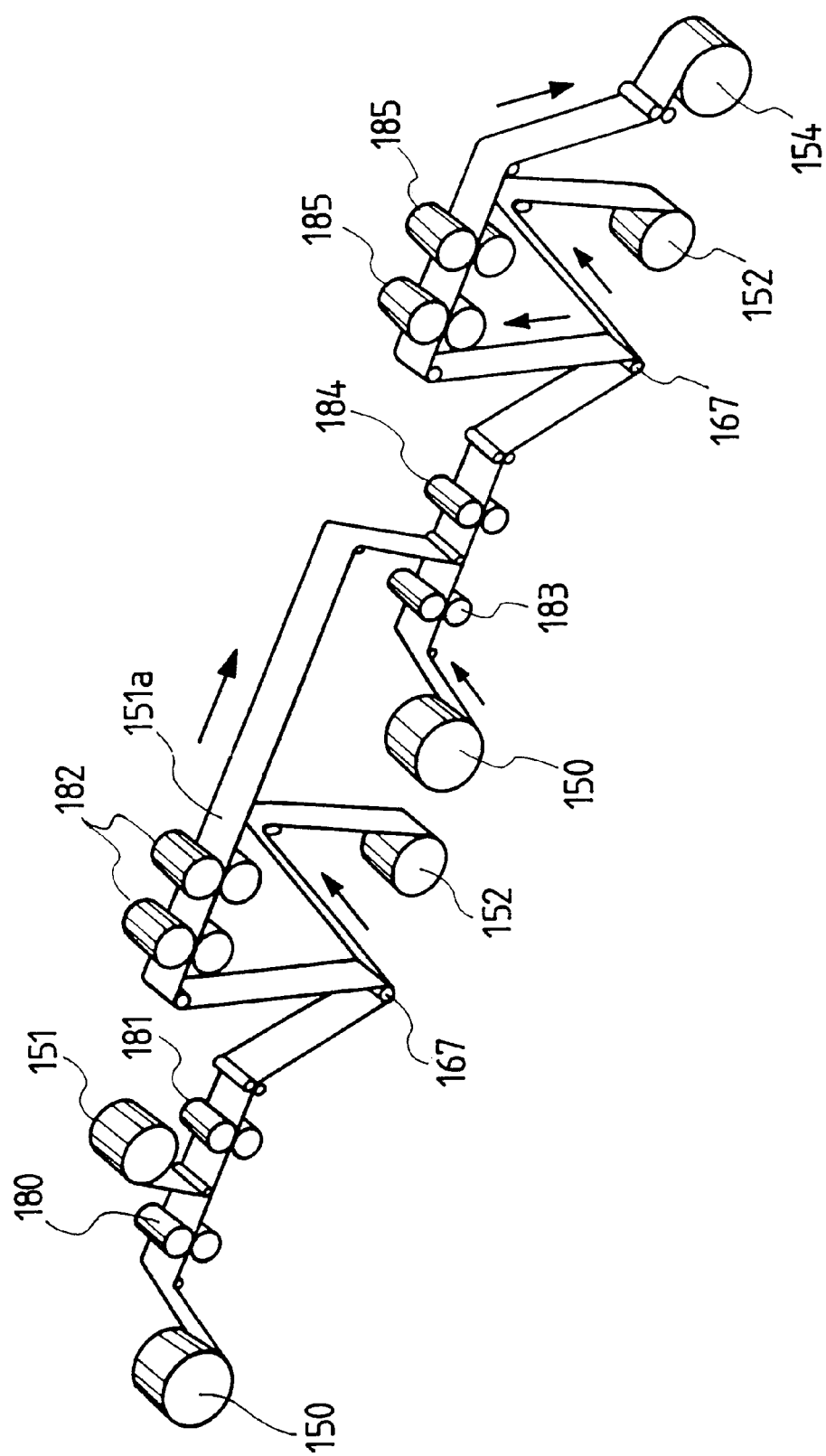
FIG. 12 is a perspective view of a still other fabrication apparatus for use in a process according to a still other embodiment of the present invention.

FIG. 12 shows another type of a fabrication apparatus for use in the continuous operation of the process according to the present invention. The apparatus differs from those described in the foregoing examples in that rolls are used in the place of plate type cutting press, heating press, and heat setting press.

Referring to FIG. 12, the apparatus comprises a first and second cutting die rolls 180 and 183, heating rolls 181 and 184, and heat setting rolls 182 and 185.

Figure 13:
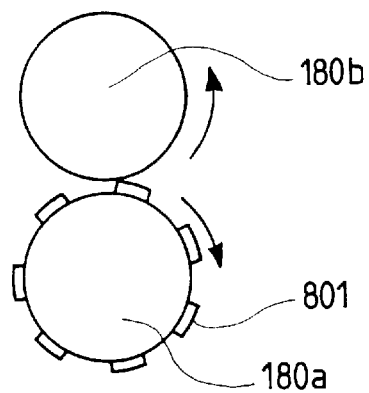
FIG. 13 is a side view showing a cutting die roll of the apparatus illustrated in FIG. 12.
Figure 14:
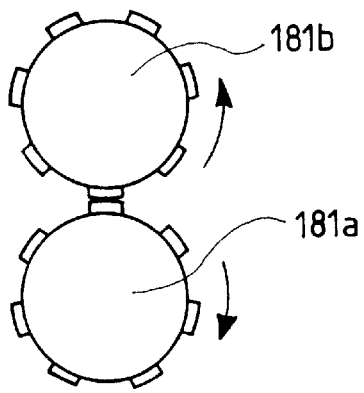
FIG. 14 is a side view showing a heating roll of the apparatus illustrated in FIG. 1.
Figure 15:
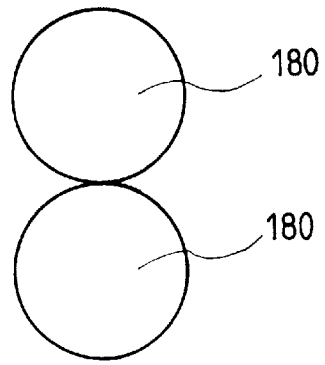
FIG. 15 is a side view showing a heat setting roll of the apparatus illustrated in FIG. 12.

Referring to FIG. 13, the cutting die rolls 180 for use in the present apparatus may be a pair of rolls comprising, for instance, a metallic roll 180a equipped with a cutting blade 801 on the surface thereof and a rubber roll 180b having a smooth surface. Referring to FIG. 14, the heat setting rolls 181 may be, for example, a pair of rolls 181a and 181b each having a heating pattern protrusions on the surface thereof in a manner similar to the relief printing rolls. Referring to FIG. 15, for instance, the pair of heat setting rolls 182 comprise two rolls each having a smooth surface.

The apparatus illustrated in FIG. 12 is essentially the same as that shown in FIG. 11, except that the presses are replaced by rolls.

EXAMPLE 5

FIG. 16 shows an exploded perspective view of a modified type of a resonant tag obtained by a process described in Example 2. A hole 113 is provided previously to a plastic dielectric film 112 that is used as the support, and circuits are provided on both sides of the dielectric film 112 using a metallic foil 102. The hole 113 perforated in the dielectric film 112 is used for connecting the circuits provided on both sides of the dielectric film 112, or for destroying the resonant circuit.

In the resonant tag according to the present example, a non-coated portion can be left over on the thermal adhesive resin film 101 formed on the surface of the metallic foil 102 of the laminate at the position corresponding to the hole 113 provided to the dielectric film 112.

Referring to FIG. 16, the resonant tag does not have a capacitor electrode section on the edges of the coil-like circuit. More specifically, coil-like metallic foil circuits 102 are formed on both sides of the dielectric film 112 so that the circuits themselves function as the capacitor electrode plates. That is, the circuits are disposed faced to each other with a dielectric film interposed therebetween. The electric energy and the like necessary for destroying the resonant circuit can be controlled by adjusting the position of the hole 113.

The present invention has been described in detail by making special reference to resonant tags and resonant labels. However, the present invention enables transfer of linearly patterned metallic foils of a desired width (e.g., from 1 mm to about 10 mm) to various types of articles. Accordingly, the application field of the present invention is not only limited to that of resonant tags, single layer printed circuit boards, multi-layered printed circuit boards, etc. Other application fields include the production of electric carpets, electric blankets, heating plates for melting snow, etc., in which the present invention is applied to heat-resistant plastic sheets and woven cloth; defoggers for automobiles, in which the present invention is applied to glass sheets; and defrosting glasses and sheets, in which the present invention is applied to glass sheets and vinyl sheets of greenhouses. It is also useful in extensive fields, inclusive of the field of manufacturing ceramic bodies such as chinawares or japan, in which metallic patterns are formed.

While the invention has been described in detail and with reference to specific embodiments thereof, it will be apparent to one skilled in the art that various changes and modifications can be made therein without departing from the spirit and scope thereof.

Figure 17:
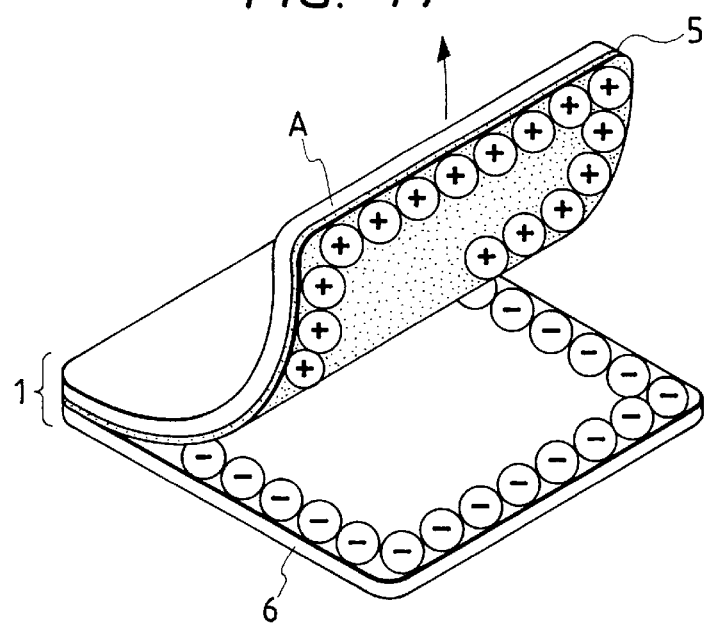
FIG. 17 shows a case that a release paper is peeled off from an adhesion coated on a resonant tag base.

In a resonant label of such a type that an adhision adhesive 5 is coated on one-side face of a resonant tag base A and a release paper 6 is covered thereon, there is a case that static electricity is generated when the release paper 6 is peeled off from the face of the adhision adhesive 5 in use of the final product. (see FIG. 17) At that time, there is possibility that resonant characteristics are lost (or diactivated) by the electrostatic discharge.

Figure 18:
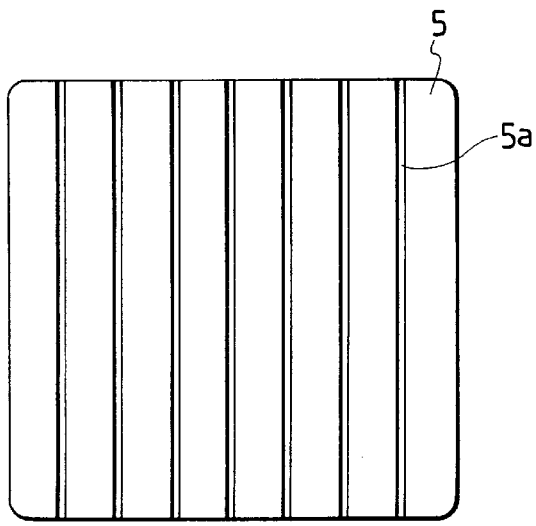
FIG. 18 shows an example that a non-coated portion on a face of a resonant tag base on which an adhesion adhesive is coated.
Figure 19:
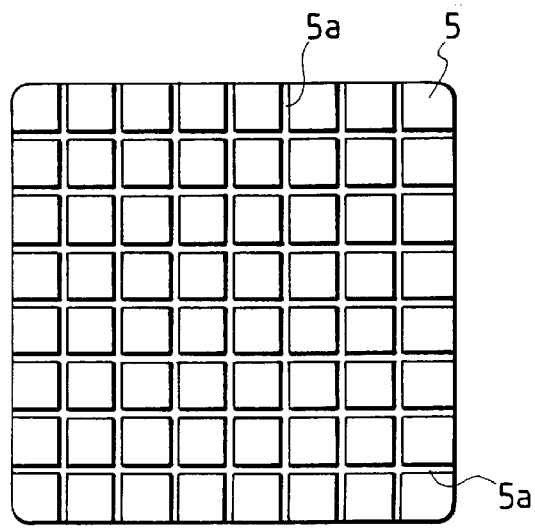
FIG. 19 shows an example that an adhesion adhesive is coated in a shape of lattice.
Figure 20:
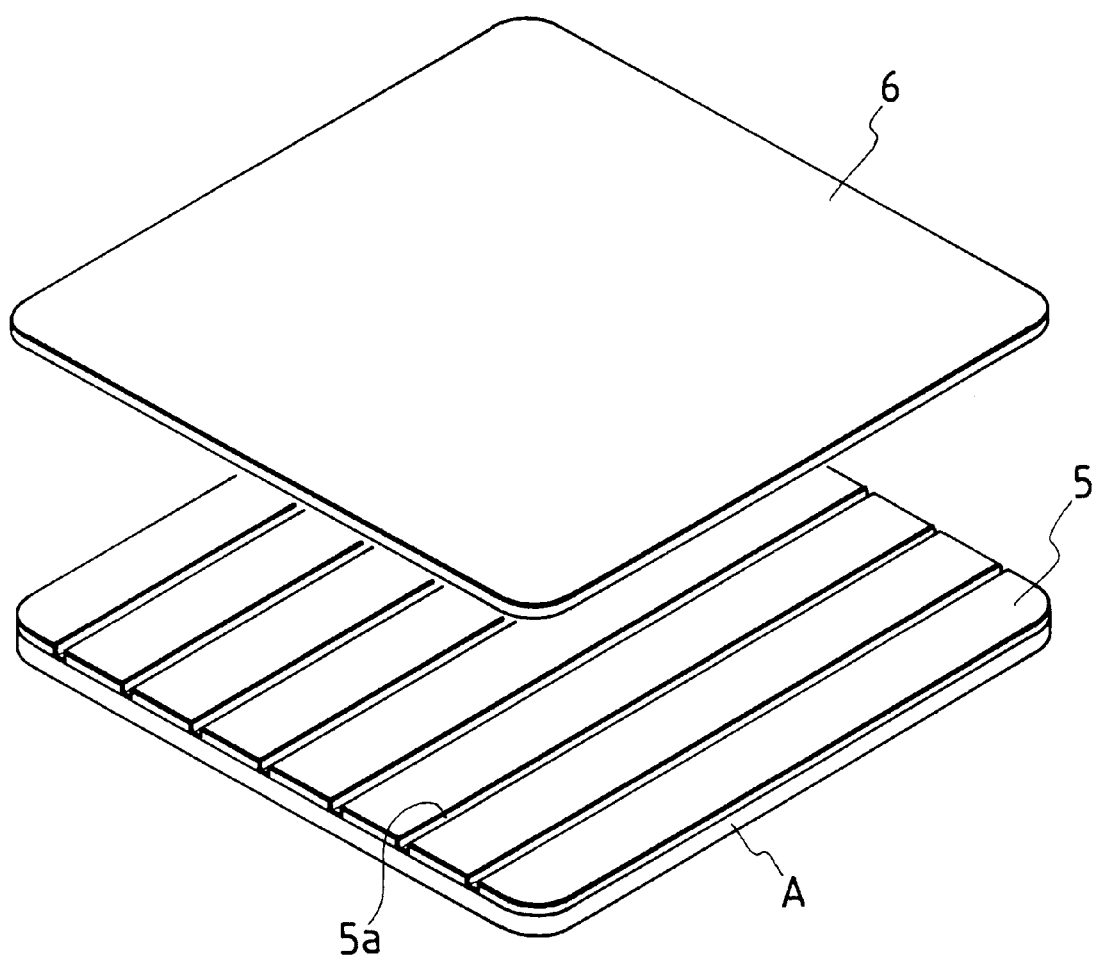
FIG. 20 is a perspective view of the example of FIG. 18.

In order to prevent such a defect, it may select an adhesion adhesive which does not cause static electricity or provide non-coated portions 5a on the face of the resonant tag material on which the adhesion adhesive is coated, as shown in FIGS. 18 to 20. FIG. 28 shows an example that the non-coated portions 5a are linearly provided. FIG. 20 shows a perspective view of the example of FIG. 18. The linear-shaped non-coated portions 5a may be provided in parallel to a direction where the release paper 6 is peeled off or may be provided at a right angle thereto. FIG. 19 shows an example that the non-coated portion 5a is provided in a shape of a lattice. On top of these examples, the adhesion adhesive may be provided in appropriate intervals, e.g., in a shape of dotted lines.

In the conventional resonant tags, a film such as plastic film has been used as a dielectric layer and coil circuits of resonant circuits have been formed on the both sides of the dielectric layer. In a method of transmitting very strong resonant frequencies to the resonant tags in the conventional method of diactivating the resonant circuits, the thickness of the dielectric layer has been thick and has not been easily shorted, so that it has been relied on oa method that a portion which is easily shorted is formed at the neighborhood of a capacitor electrode plate section provided at the end portion of the resonant circuits.

In the present invention, the dielectric layer is different from the conventional plastic film and is formed from very thin resin layer having dielectric characteristics and having several microns in thickness and which has also a role of an adhesive. In a case that strong dielectric frequencies are transmitted to the resonant circuits in the conventional method, a large number of electrons are accumulated at a portion, e.g., end portion(s) of bent portion(s) of coil circuits, which is electrically most weak, and a dielectric layer at that portion is destroyed and electrically shorted, whereby the circuits which have been arranged to be constant frequencies can be destroyed. As the electrically most weak portion, it will not be limilted to the bent portion of the coil circuit, but it may be prepared by narrowing the width of the coil circuit or partly narrowing parts of the coil circuit.

The above-mentioned effects of destroying circuits are remarkably exerted in a case of a resonant tag in which a capacitor electrode plate section ois not formed at the end portion of the resonant circuit and instead, two coil circuits which form a resonant circuit are opposed to each other by sandwiching the dielectric layer and are plasted to utilize the circuits themselves as a capacitor electrode plate section.

Figure 21:
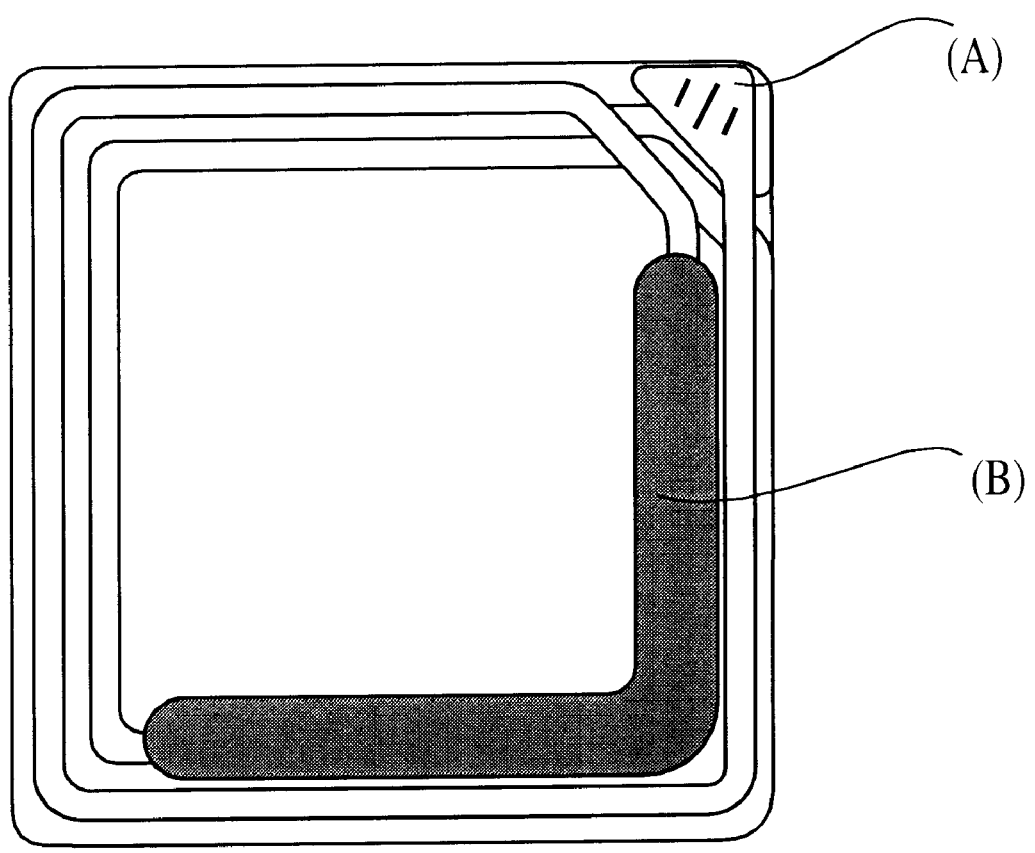
FIG. 21 is a plan view of an embodiment of the invention.

Referring now to FIG. 21, which shows an embodiment of the invention, "A" shows shorting portions of two coils, and "B" shows the range of the destroyed portion. This range becomes electrically the most weak portion, but other portions may become exceptionally electrically weak.

What is claimed is:

1. A resonant tag in which an adhesion adhesive is coated on predetermined portions of at least one face of a resonant tag base comprising a circuit-like metallic foil adhered to each side of a dielectric film prepared from a solution of a resin dissolved in a solvent by a coating process, the circuit-like metal foil pattern on one side of the dielectric film being aligned with the circuit-like metal foil pattern on the other side of the dielectric film so as to form with the dielectric film a capacitor, said coating of the adhesion adhesive leaving uncoated portions between said coated portions, and a release paper applied on the upper face of the adhesive-coated base, the width of the uncoated portions being such that the generation of static electricity is avoided when the release paper is peeled from the adhesion adhesive.

2. A resonant tag claimed in claim 1, wherein the non-coated portion is in a linear shape or a lattice shape.

* * * * *